US011067245B2

(12) United States Patent
Gloss et al.

(10) Patent No.: US 11,067,245 B2
(45) Date of Patent: Jul. 20, 2021

(54) LIGHT DEVICE, ESPECIALLY A SIGNAL LAMP, FOR A MOTOR VEHICLE

(71) Applicant: Varroc Lighting Systems, s.r.o., Senov u Noveho Jicina (CZ)

(72) Inventors: Tomas Gloss, Vitkov (CZ); Petr Novak, Senov u Noveho Jicina (CZ); Tomas Mateju, Bartosovice na Morave (CZ)

(73) Assignee: Varroc Lighting Systems, S.R.O., Senov u Noveho (CZ)

( * ) Notice: Subject to any disclaimer, the term of this patent is extended or adjusted under 35 U.S.C. 154(b) by 0 days.

(21) Appl. No.: 17/123,368

(22) Filed: Dec. 16, 2020

(65) Prior Publication Data
US 2021/0190288 A1    Jun. 24, 2021

(30) Foreign Application Priority Data

Dec. 19, 2019    (CZ) ............................... CZ2019-791

(51) Int. Cl.
*F21S 43/40*    (2018.01)
*F21S 43/31*    (2018.01)
(Continued)

(52) U.S. Cl.
CPC ............. *F21S 43/40* (2018.01); *F21S 43/255* (2018.01); *F21S 43/26* (2018.01); *F21S 43/315* (2018.01);
(Continued)

(58) Field of Classification Search
CPC ........ F21V 13/04; F21V 7/0091; F21S 41/20; F21S 41/285; F21S 43/20; F21S 43/235;
(Continued)

(56) References Cited

U.S. PATENT DOCUMENTS 7,261,454 B2    8/2007    Ng
2015/0167925 A1    6/2015    Lin et al.
(Continued)

FOREIGN PATENT DOCUMENTS

DE    102010018119 A1    10/2011
WO    2014/086782 A1    6/2014
(Continued)

OTHER PUBLICATIONS

Search Report dated Jun. 4, 2020, from Corresponding Czech Patent Application No. PV 2019-791 (3 pages).

*Primary Examiner* — Alexander K Garlen
*Assistant Examiner* — Colin J Cattanach
(74) *Attorney, Agent, or Firm* — Hovey Williams LLP

(57) ABSTRACT

The light device comprises an optical module (17), comprising a light source (5) and an associated optical body (8) of a transparent material to bind light rays (10) emitted by the source (5). The source (5) is a multidirectional light source configured to emit the primary light beam (6) of rays (10) towards the cover (1), and secondary beams (7) comprising rays (10) that are approximately transversal with respect to the rays (10) of the primary beam (6). The body (8) has a front surface (12) that forms a central front recess (18) in the body (8), a rear surface (14) that is opposite to the front surface (12) and is, in the direction from the optical axis (x) of the optical module (17), which passes through the source (5), inclined towards the cover (1), and a lateral surface (13) connecting the front surface (12) with the rear surface (14). The deepest point of the front recess (18) is situated approximately at the optical axis (x). The rear surface (14) and the lateral surface (13) are configured to prevent rays (10) from passing through these surfaces (14, 13).

17 Claims, 3 Drawing Sheets

Figure 1:
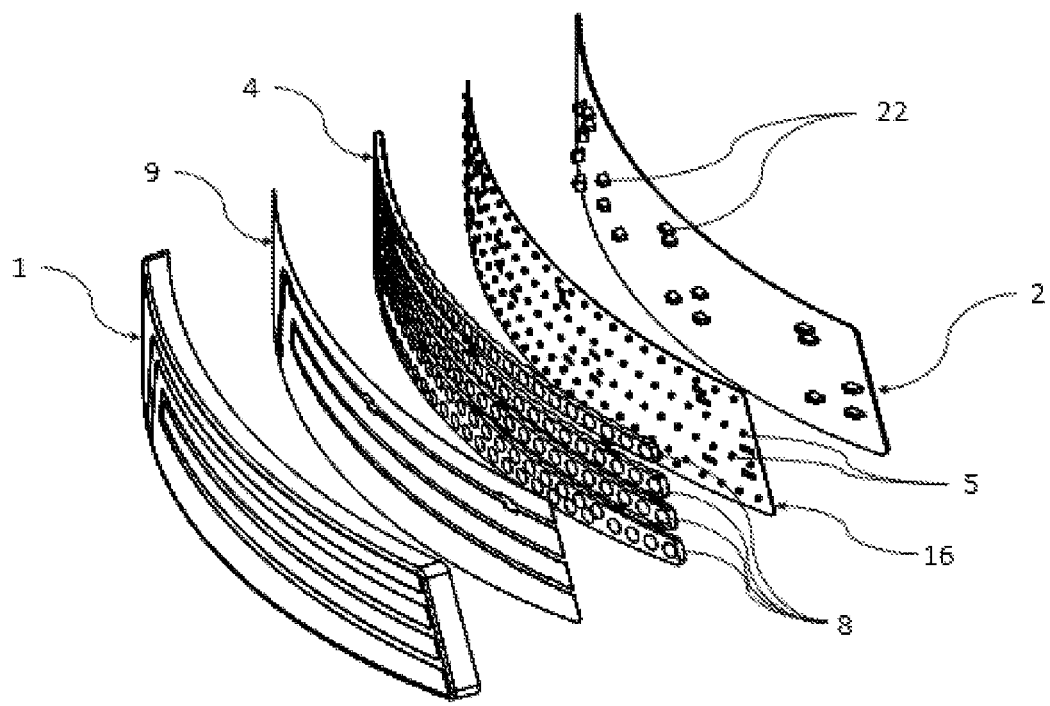

(51) Int. Cl.
*F21S 43/20* (2018.01)
*F21S 41/20* (2018.01)
*F21V 7/00* (2006.01)
*F21S 43/241* (2018.01)
*H01L 33/08* (2010.01)
*F21V 13/04* (2006.01)
*F21S 43/235* (2018.01)

(52) U.S. Cl.
CPC ............... *F21S 41/20* (2018.01); *F21S 41/285* (2018.01); *F21S 43/20* (2018.01); *F21S 43/235* (2018.01); *F21S 43/241* (2018.01); *F21V 7/0091* (2013.01); *F21V 13/04* (2013.01); *H01L 33/08* (2013.01)

(58) Field of Classification Search
CPC ........ F21S 43/241; F21S 43/26; F21S 43/315; F21S 43/40
See application file for complete search history.

(56) References Cited

U.S. PATENT DOCUMENTS

2017/0219181 A1 8/2017 Lisowski et al.
2017/0254500 A1* 9/2017 Leugers ................... B60Q 1/14

FOREIGN PATENT DOCUMENTS

WO WO-2016009733 A1 * 1/2016 ............ F21S 43/241
WO 2016/050237 A1 4/2016

* cited by examiner

LIGHT DEVICE, ESPECIALLY A SIGNAL LAMP, FOR A MOTOR VEHICLE

RELATED APPLICATIONS

This application claims the priority benefit of Czech Patent Application Serial No. PV 2019-791 entitled "A light device, especially a signal lamp, for a motor vehicle," filed Dec. 19, 2019, the entire disclosure of which is incorporated herein by reference

FIELD OF THE INVENTION

The invention relates to a light device, especially a signal lamp, for motor vehicles, comprising a transparent or translucent cover and at least one lighting unit with at least one light source to emit light rays.

BACKGROUND INFORMATION

A lamp, especially for motor vehicles, contains multiple lighting units wherein each of these lighting units provides a different light function or contributes to ensuring the required emission characteristic of the light trace. Individual lighting units are generally mounted in a shaped carrying housing of the lamp, wherein each unit contains at least one light source and other optical elements. The light source emits light rays and the optical elements represent a system of refractive and reflective surfaces and interfaces of optical environments that influence the direction of light rays of created output light trace. With the use of optical components, e.g., by means of a filter with a microstructure, or with the use of a suitable array of optical elements, high homogeneity, or a 3D effect of the output light beam can be achieved. A disadvantage of the prior art is the fact that the commonly used arrangements of individual optical components bring increased installation requirements. In light devices using standard point light sources, e.g. LED's, ultra-thin installation dimensions cannot be achieved as the LED light source emits light mainly in one main direction, which brings with itself certain geometrical limits and limitations influencing the inner installation space of the light device.

The documents U.S. Pat. No. 7,261,454B2, WO2014086782A1, US20150167925A1 disclose multidirectional or multi-direction light sources making it possible to send light beams with variable light intensities to various directions. Generally, a main light beam is sent in the main straight direction and a secondary light beam is sent in a lateral direction while higher intensity light is sent in the lateral direction than in the straight direction. A disadvantage of these multidirectional light sources is the fact that a multidirectional source by itself does not ensure high homogeneity or a spatial effect of a light beam exiting the light device.

The object of the invention is to design a light device, especially a signal lamp for motor vehicles, that has low requirements for integration into the vehicle body, and at the same time makes it possible to create spatial light patterns or meet other design requirements for the output light beam.

SUMMARY OF THE INVENTION

The above-mentioned objects of the invention are fulfilled by a light device, especially a signal lamp, for motor vehicles, comprising an outer cover separating the inner chamber of the light device from the external environment of the motor vehicle, and at least one optical module situated in the chamber, comprising a light source and an associated optical body of a transparent material to bind light rays emitted by the source, for passage of rays through the body and their exit from the body towards the cover. The source is a multidirectional light source configured to emit the primary light beam of rays towards the cover, and secondary beams comprising rays that are approximately transversal with respect to the rays of the primary beam. The body has a front surface that is situated between the cover and source and forms a central front recess in the body extending over most of the front surface. The body further comprises a rear surface that is opposite to the front surface and is, in the direction from the optical axis of the optical module, which passes through the source, inclined towards the cover, and a lateral surface connecting the front surface with the rear surface where the deepest point of the front recess is situated approximately at the optical axis. The front surface is configured to reflect a part of rays of the primary beam towards the rear surface and for the passage of another part of rays of the primary beam through the front surface out of the body towards the cover, and it is further configured for the passage of rays that got reflected from the lateral surface or the rear surface before falling onto the front surface, through the front surface out of the body towards the cover, the rear surface is configured to reflect rays falling onto it directly or indirectly by means of subsequent reflection from the lateral surface to the front surface, and the lateral surface is configured to reflect rays falling onto it to the front surface or the rear surface, the rear surface and the lateral surface being configured to prevent rays from passing through these surfaces.

According to one of the embodiments, the lateral and rear surfaces are configured as mirror surfaces.

The lateral and rear surfaces can be equipped with a reflective layer, especially a mirror layer or diffusion layer, for instance a white reflective layer.

According to one of the embodiments, the said central front recess and the rear recess are part of approximately conical surfaces having their apices lying approximately at the optical axis.

According to one of the embodiments, the body comprises a rear recess surrounded by the rear surface. The source can be situated in this rear recess.

According to one of the preferred embodiments, the source is in contact with the body. The source may be for instance embedded in the body material.

The source can be attached to a thin-walled carrier, the body being situated between the source and the cover. At least a part of the rear surface may be situated at a distance from the thin-walled carrier.

According to another preferred embodiment, the thin-walled carrier is shaped in such a way that all the rear surface and/or the lateral surface of the body is in contact with the thin-walled carrier.

According to another preferred embodiment, the thin-walled carrier is configured in such a way that the carrier wall in the locations where the carrier is in contact with the rear surface and/or lateral surface forms a reflective layer that the rear surface and/or the lateral surface of the body is equipped with.

According to yet another embodiment, the thin-walled carrier is shaped in such a way that a recess is formed in it whose shape corresponds to the shape of the body, the body being a casting located in this recess.

According to another embodiment, the carrier is foil.

The light device may comprise a number of optical modules, wherein the sources are attached to a common thin-walled carrier.

According to one of the embodiments, at least a part of the rear surface of the bodies is situated at a distance from the thin-walled carrier and the bodies are carried by an optical board located against the thin-walled carrier.

According to yet another embodiment, between the front surfaces of the bodies and the cover, a functional layer is situated approximately in parallel to the cover and configured to direct light rays that exit from its surface averted from the body to a predetermined direction or directions and/or for their homogenization.

The cover may comprise a filter adapted to diffuse/homogenize and/or direct rays passing through the cover.

CLARIFICATION OF DRAWINGS

Figure 2:
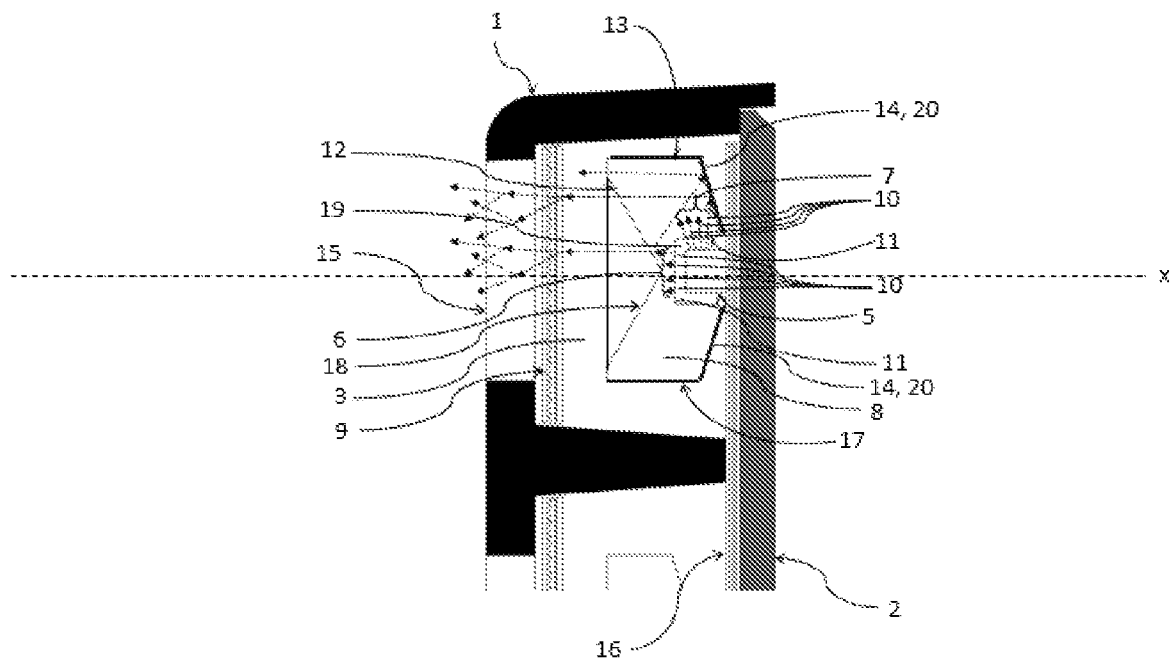
Figure 3:
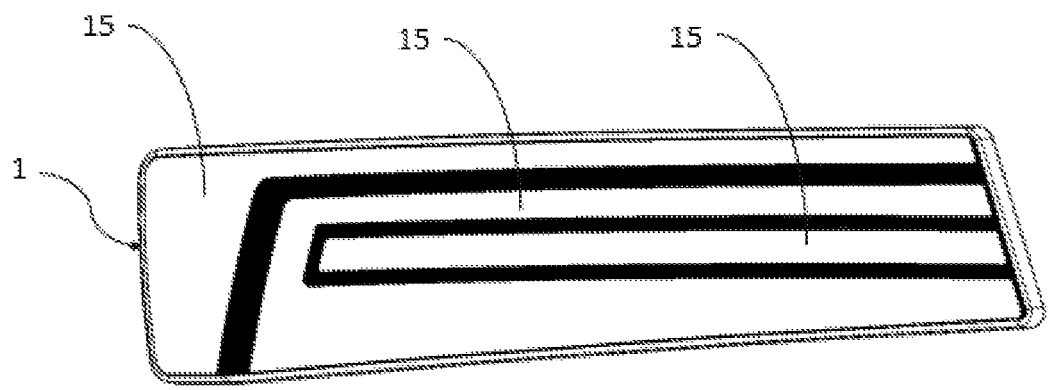
Figure 4:
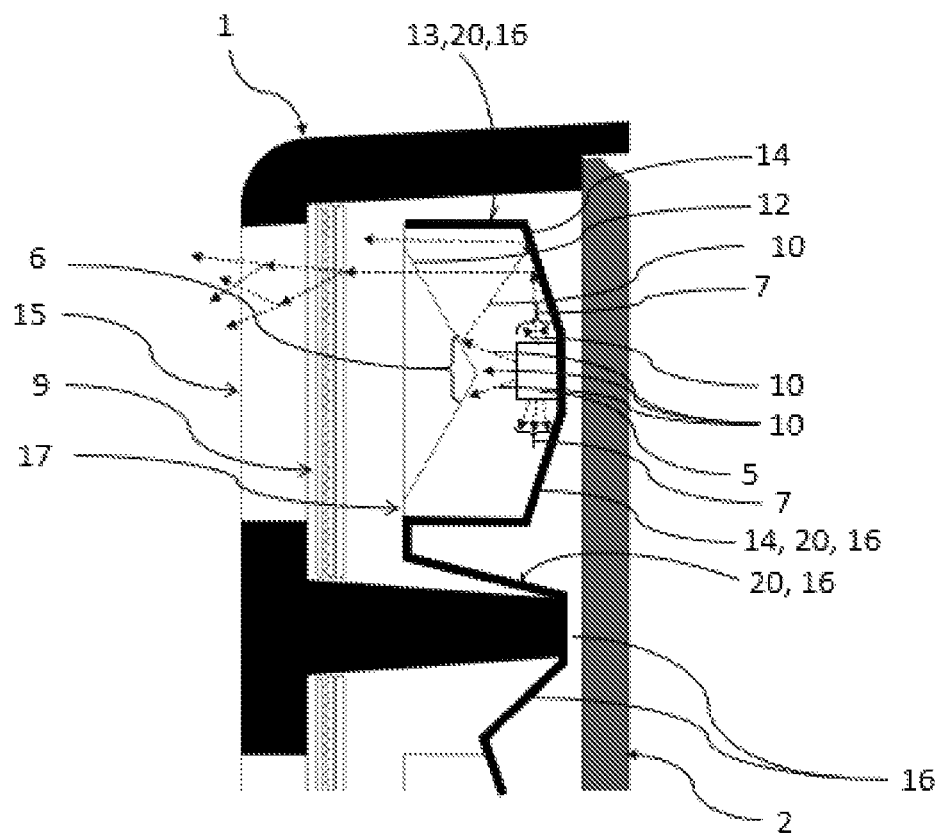
Figure 5:
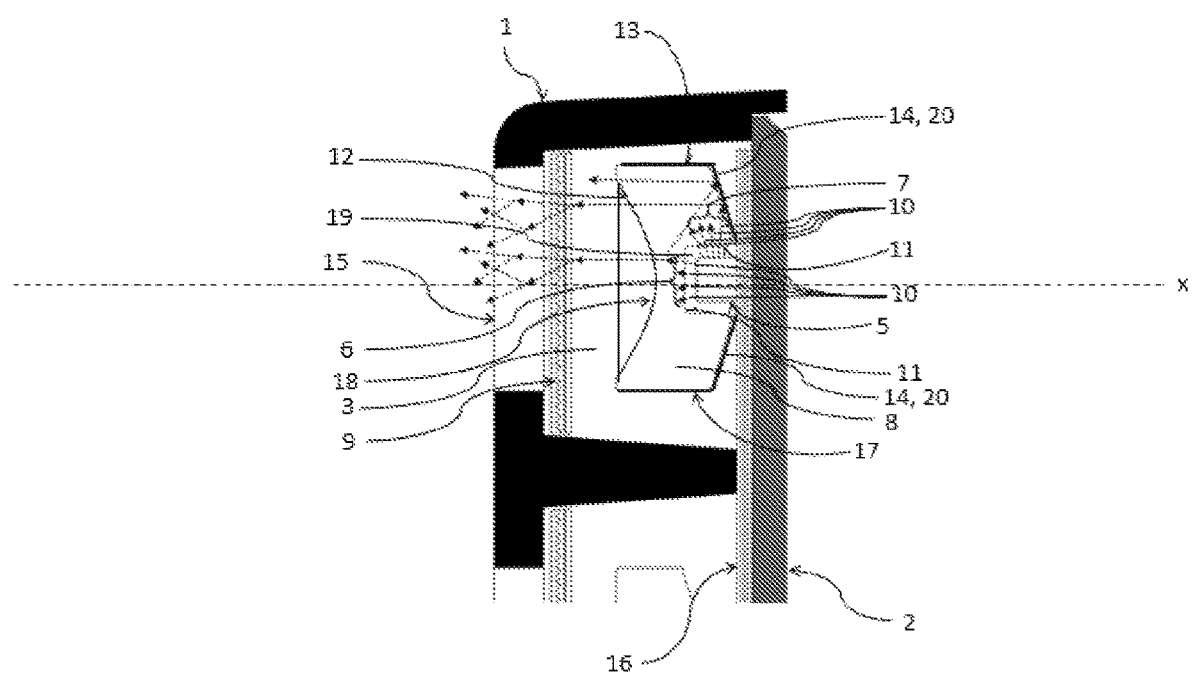

The invention will be clarified in a more detailed way with the use of embodiment examples with references to attached drawings, where:

FIG. 1 shows in an exploded view the first embodiment example of the light device according to the invention, FIG. 2 shows a vertical cross-section of the first embodiment example of the light device, taken through the optical axis of one of the optical modules contained in the light device, FIG. 3 shows the front view of the first embodiment example of the light device, FIG. 4 shows a vertical cross-section of the second embodiment example of the inventive light device, taken through the optical axis of one of the optical modules contained in the light device, and FIG. 5 shows a vertical cross-section of the third embodiment example of the inventive light device, taken through the optical axis of one of the optical modules contained in the light device.

EXAMPLES OF EMBODIMENTS OF THE INVENTION

FIGS. 1 to 3 show various views of the first embodiment example of the light device according to the invention.

FIG. 1 shows the light device in an exploded view. The light device comprises a carrier plate 2 intended to be attached to the front cover 1, which is transparent or translucent in at least some of its regions. The cover 1 and the carrier plate 2 delimit an inner chamber 3 between them. The carrier plate 2 is fitted with locating protrusions 22 at its inner side. A thin-walled carrier 16 carrying the light sources 5, an optical board 4 comprising optical bodies 8 and a functional layer 9 are situated between the carrier plate 2 and the cover 1, starting from the carrier plate 2. The locating protrusions 22 pass through the respective openings in the thin-walled carrier 16, optical plate 4 and functional layer 9 and delimit their mutual position. Thus, the light device is delimited at its rear side by the carrier plate 2 that the translucent or transparent cover 1 is attached to in such a way that the carrier plate 2 and the cover 1 define the inner chamber 3 of the light device between them. During the operation of the light device installed in a vehicle, the cover 1 is, with its outer side, in contact with the surrounding environment that is found outside the vehicle.

FIG. 2 shows a vertical cross-section of the first embodiment example of the light device in the assembled condition, taken through the optical axis x of one of the optical modules 17 contained in the light device. The optical axis x of the optical module 17 is generally an axis of an overall light beam comprised of light rays leaving an output front surface 12 of the optical module 17. One or more optical modules 17 can be housed in the chamber 3. The embodiment shown in FIGS. 1 to 3 presents an example in which light device comprises a number of optical modules 17 situated next to each other. As shown in FIG. 2, each optical module 17 comprises a light source 5 to generate light rays 10 and an optical body 8 the light source 5 is associated with. At the same time, the light source 5 may comprise one or more LED's or chips situated close to each other. The light source 5 is a multidirectional source configured to generate the primary light beam 6 of light rays 10 towards the cover 1, and at least one secondary light beam 7 comprising light rays 10 that are approximately transversal to the rays 10 of the primary beam 6. The light source 5 may be configured to emit one or more secondary beams 7 whose axes generally lie on a plane that is perpendicular to the optical axis x of the optical module 17 and passes through the source 5. In the particular embodiment of FIG. 2, the light source 5 emits secondary beams 7 to all sides approximately transversally to the optical axis x though only one secondary beam 7 is shown in FIG. 2 for simplicity. As mentioned above, the optical module 17 comprises an optical body 8 of a translucent or transparent material, configured to bind light rays 10 emitted by the source 5 to the body 8, to guide the rays 10 through the body 8, and finally to ensure their exit from the body 8 through its front surface 12 towards the cover 1. The shape of the front surface 12 is such that it forms a front recess 18 in the body 8, which may for instance have a conical shape. The front surface 12 is situated between the cover 1 and the source 5. Further, the body 8 is delimited by its rear surface 14, which is opposite to the front surface 12, and the lateral surface 13 connecting the front surface 12 with the rear surface 14. In the embodiment shown, the front surface 12 and rear surface 14 are part of approximately conical surfaces with apices lying approximately at the optical axis x of the optical module 17, which passes through the source 5. As mentioned above, however, the front recess 18 does not necessarily have to be of a conical shape, other than conical shapes are also possible, e.g. a generally dish-like shape, the shape of an optical lens (e.g. ball-shaped) etc.

The body 8 comprises entry areas 11 adapted to bind the light rays 10 of the primary beam 6 and the secondary beams 7 and defining the rear recess 19 in the body 8. As shown in FIG. 2, the front surface 12 is configured for total reflection of a part of the rays 10 of the primary beam 6 towards the rear surface 14 while another part of the rays 10 of the primary beam 6 that fall onto the front surface 12 under a smaller angle than the critical angle, i.e. under an angle that enables passage through the front surface 12, passes through the front surface 12 out of the body 8 towards the cover 1. Light rays 10 that got reflected from the rear wall 14 or the lateral wall 13 before falling onto the front surface 12 also pass through the front surface 12 out of the body 8 towards the cover 1. The rear surface 14 is configured for direct, or also possibly by means of subsequent reflection from the lateral surface 13, indirect reflection of rays 10 falling onto it towards the front surface 12. The lateral surface 13 and the rear surface 14 are configured to prevent exit of light rays 10 out of the body 8 through these surfaces 13, 14. The reflection of rays 10 from the lateral surface 13 and the rear surface 14 may for instance be based on the principle of total reflection (on condition that this will satisfactorily meet the requirement of preventing exit of light rays 10 out of the body 8 through these surfaces 13, 14), however, these surfaces may be fitted with a reflective layer 20 as in the embodiment shown. The reflective layer 20 may e.g. be a mirror or diffusion one. If it is a diffusion layer, it is preferably a layer 20 of white color.

As shown in FIGS. 1 and 2, the rays 10 that have passed through the front surface 12 out of the body 8 towards the cover 1 fall onto a functional layer 9, configured to homogenize and/or direct light rays 10 that exit from the surface of the functional layer 9 averted from the body 8 to a predetermined direction or directions. As indicated in FIG. 2 and FIG. 3, the front cover 1 of this embodiment comprises a segment or filter 15 configured for diffusion of light rays 10 passing through the front cover 1 and/or for their directing.

FIG. 4 shows the second example of an embodiment of the light device according to the invention. Similarly to FIG. 2, this is also a vertical cross-section of the light device, taken through the optical axis x of one of the optical modules contained in the light device. However, this embodiment differs from the embodiment of FIGS. 1 to 3 especially in that the thin-walled carrier 16 is spatially shaped in such a way that the lateral surface 13 and the rear surface 14 of the optical bodies 8 bear on the inner surface of the thin-walled carrier 16. Thus, the optical board 4 and the thin-walled carrier 16 are in mutual contact in the locations of the rear surfaces 14 and the inner surface of the thin-walled carrier 16 in these locations serves as a reflective surface for light rays 10 falling onto the rear surface 14. The production process of this second embodiment of the invention is such that the thin-walled carrier 16 in the form of flexible foil of preferably white color is fitted with the respective electronic equipment (light sources 5 and conductive paths, driver etc.), subsequently, the thin-walled carrier 16 is placed in a mold, 3D shaped and then the optical board 4 comprising optical bodies 8 is added to it by injection. In the second embodiment of the invention, there is no air gap between the optical board 4 and the thin-walled carrier 16 unlike the first embodiment.

FIG. 5 shows the third example of an embodiment of the light device according to the invention. This is also a vertical cross-section of the light device, taken through the optical axis x of one of the optical modules 17 contained in the light device. However, this embodiment differs from the previous embodiments of FIGS. 1 to 4 in that the shape of the front surface 12 is such that it forms a front recess 18 in the body 8 having the shape of an optical lens, e.g. a ball-shaped one.

LIST OF REFERENCE MARKS

1—front cover
2—carrier plate
3—chamber
4—optical board
5—source
6—primary beam
7—secondary beam
8—optical body
9—functional layer
10—ray
11—entry area
12—front surface
13—lateral surface
14—rear surface
15—filter
16—thin-walled carrier
17—optical module
18—front recess
19—rear recess
20—reflective layer
22—locating protrusions
X—optical axis

The invention claimed is:

1. A light device for a motor vehicle, comprising an outer cover separating an inner chamber of the light device from the external environment of the motor vehicle, and at least one optical module situated in the chamber comprising a light source and an associated optical body of a transparent or translucent material, the optical body being designed to bind light rays emitted by the source and to enable passage of rays through the optical body and their exit from the optical body towards the cover, wherein the source is a multidirectional light source configured to emit the primary light beam of rays towards the cover, and secondary beams comprising rays that are approximately transversal with respect to the rays of the primary beam, the optical body having a front surface that is situated between the cover and source and forms a central front recess in the optical body extending over most of the front surface, wherein the optical body comprises:

a rear surface that is opposite to the front surface and is, in the direction from the optical axis (x) of the optical module, which optical axis (x) passes through the source, inclined towards the cover, and a lateral surface connecting the front surface with the rear surface, wherein the deepest point of the front recess is situated approximately at the optical axis (x), wherein the front surface is configured to reflect a part of rays of the primary beam towards the rear surface and to enable passage of another part of rays of the primary beam through the front surface out of the optical body in a direction towards the cover, wherein the front surface is further configured for passage of rays that got reflected from the lateral surface or the rear surface before falling onto the front surface, through the front surface out of the optical body towards the cover, wherein the rear surface is configured to reflect rays falling onto it directly or indirectly by means of subsequent reflection from the lateral surface to the front surface, wherein the lateral surface is configured to reflect rays falling onto it to the front surface or the rear surface, wherein the rear surface and the lateral surface are configured to prevent rays from passing through these surfaces.

2. The light device according to claim 1, wherein the lateral and rear surfaces are configured as mirror surfaces.

3. The light device according to claim 1, wherein the lateral and rear surfaces are fitted with a reflective layer, such as a mirror layer, diffusion reflective layer, or a white reflective layer.

4. The light device according to claim 1, wherein the central front recess and the rear surface are part of approximately conical surfaces having their apices lying approximately at the optical axis (x).

5. The light device according to claim 1, wherein the optical body comprises a rear recess surrounded by the rear surface, and the source is situated in the rear recess.

6. The light device according to claim 1, wherein the source is in contact with the optical body.

7. The light device according to claim 1, wherein the source is embedded in the material of the optical body.

8. The light device according to claim 1, wherein the source is attached to a thin-walled carrier, the optical body being situated between the carrier and the cover.

9. The light device according to claim 8, wherein at least a part of the rear surface of the body is situated at a distance from the thin-walled carrier.

10. The light device according to claim 8, wherein the thin-walled carrier is shaped in such a way that the entire rear surface and/or lateral surface of the body is in contact with the thin-walled carrier.

11. The light device according to claim 10, wherein the thin-walled carrier is configured in such a way that the carrier wall in the locations where the carrier is in contact with the rear surface and/or lateral surface forms a reflective layer that the rear surface and/or the lateral surface of the body is equipped with.

12. The light device according to claim 8, wherein the thin-walled carrier is shaped in such a way that a recess is formed in it whose shape corresponds to the shape of the optical body, the optical body being a casting located in this recess.

13. The light device according to claim 8, wherein the carrier is foil.

14. The light device according to claim 1, wherein the light device comprises a number of optical modules, the sources being attached to a common thin-walled carrier.

15. The light device according to claim 14, wherein at least a part of the rear surface of the optical body is situated at a distance from the thin-walled carrier, and the optical bodies are carried by an optical board situated against the thin-walled carrier.

16. The light device according to claim 14, wherein between the front surfaces of the optical bodies and the cover, a functional layer is situated approximately in parallel to the cover and configured to direct light rays that exit from its surface averted from the optical body to a predetermined direction or directions and/or to homogenize the light rays.

17. The light device according to claim 14, wherein the cover comprises a filter adapted for diffusion/homogenization and/or directing of rays passing through the cover.

\* \* \* \* \*